United States Patent
Chang (10) Patent No.: US 12,185,488 B2
(45) Date of Patent: Dec. 31, 2024

(54) RAIL MOUNTING KIT

(71) Applicant: ANTAIRA TECHNOLOGIES, LLC, Brea, CA (US)

(72) Inventor: Chialu Chang, New Taipei (TW)

(73) Assignee: Antaira Technologies, LLC, Brea, CA (US)

( * ) Notice: Subject to any disclaimer, the term of this patent is extended or adjusted under 35 U.S.C. 154(b) by 6 days.

(21) Appl. No.: 18/185,474

(22) Filed: Mar. 17, 2023

(65) Prior Publication Data

US 2024/0268051 A1  Aug. 8, 2024

(30) Foreign Application Priority Data

Feb. 4, 2023  (TW) ................................. 112201012

(51) Int. Cl.
*H05K 7/14*  (2006.01)
*F16M 13/02*  (2006.01)

(52) U.S. Cl.
CPC ............. *H05K 7/14* (2013.01); *F16M 13/022* (2013.01)

(58) Field of Classification Search
CPC ....... H05K 7/12; H05K 7/1474; H05K 7/1415
USPC .......................................... 439/532, 716, 717
See application file for complete search history.

(56) References Cited

U.S. PATENT DOCUMENTS

| | | | |
|---|---|---|---|
| 6,292,076 B1 * | 9/2001 | DeGrazia | H02B 1/052 361/807 |
| 9,276,333 B1 * | 3/2016 | Wu | H01R 9/2608 |
| 10,790,641 B1 | 9/2020 | Yao et al. | |
| 11,576,275 B2 * | 2/2023 | Huang | H05K 7/12 |
| 2009/0286422 A1 * | 11/2009 | Henkel | H02B 1/052 439/532 |
| 2015/0181745 A1 * | 6/2015 | Hand | H05K 7/1417 403/326 |
| 2022/0069550 A1 * | 3/2022 | Ofenloch | H02B 1/16 |
| 2022/0279672 A1 | 9/2022 | Huang | |

FOREIGN PATENT DOCUMENTS

CN  215773932 U  2/2022
TW  201023721 A *  6/2010

* cited by examiner

*Primary Examiner* — Kimberly T Wood
(74) *Attorney, Agent, or Firm* — Rosenberg, Klein & Lee (57) ABSTRACT

A rail mounting kit includes a base, a sliding member, multiple positioning pins, and an elastic member. The base having two upper hooks, two limiting members, and a lower connecting portion. Each upper hook has an upper groove. The sliding member has an upper connecting portion located above the lower connecting portion, upper inclined edges, and lower grooves located lower than the upper grooves. The positioning pins are mounted through the sliding member to allow the sliding member to slide relative to the positioning pins. Two ends of the elastic member are respectively connected to the lower connecting portion and the upper connecting portion. Because the sliding member is able to slide upwardly and downwardly relative to the upper hooks to clamp on a rail, installation or uninstallation of the rail mounting kit is easy and convenient.

6 Claims, 8 Drawing Sheets

RAIL MOUNTING KIT

BACKGROUND OF THE INVENTION

1. Field of the Invention

The present invention relates to a rail mounting kit, and more particularly to a rail mounting kit for a DIN (Deutsches Institut für Normung, the German Institute for Standardization) rail.

2. Description of Related Art

Nowadays, a lot of power supplies, servers, or power over Ethernet (PoE) switches are used in the technology industry, especially in the information technology industry regarding computer network. In order to organizing multiple electronic devices, each electronic device is usually mounted to DIN (Deutsches Institut für Normung, the German Institute for Standardization) rails. DIN rails are rails in standardized sizes. Specifically, the DIN rail is a metal rack for mounting the electronic device. Detailed structure of the DIN rail is common knowledge already and is not further explained here. The electronic device is usually connected to a DIN rail via a DIN rail mounting kit. In other words, the DIN rail mounting kit is mounted to the electronic device, and then is connected to the DIN rail to connect the electronic device to the DIN rail.

Figure 7:
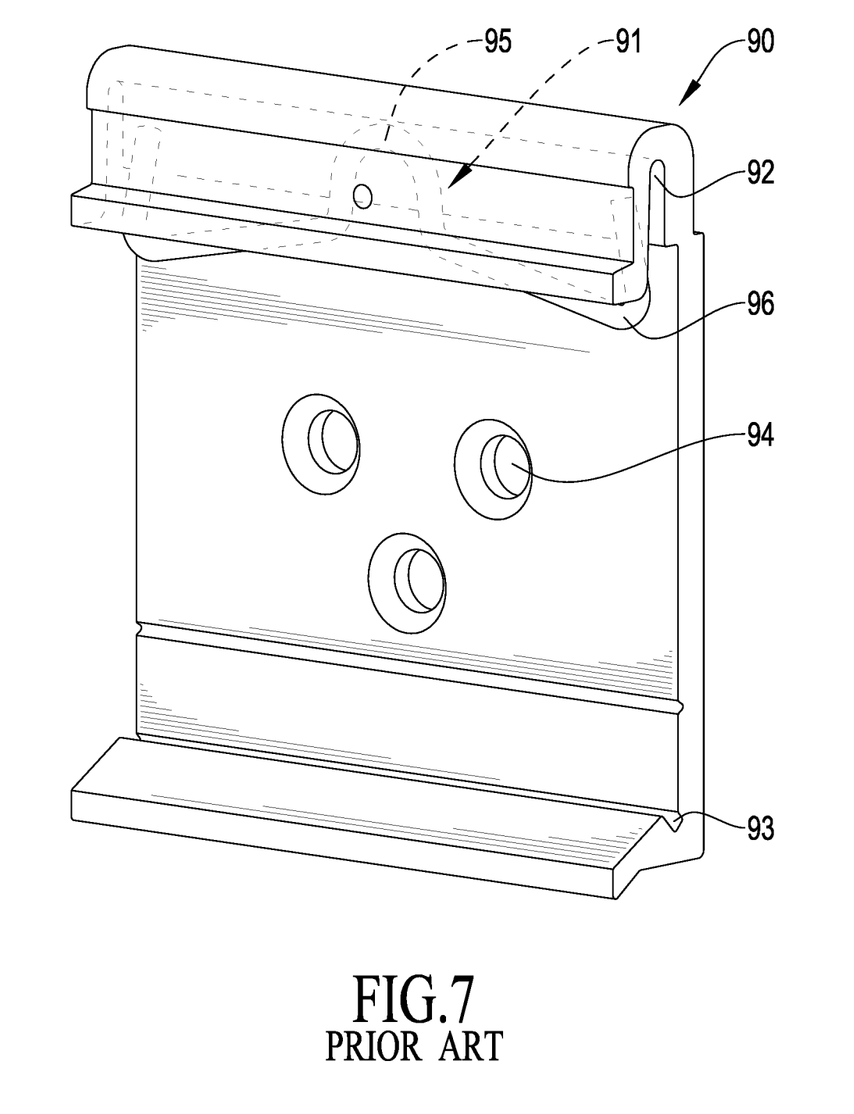
FIG. 7 is a perspective view of a conventional DIN rail mounting kit.
Figure 8:
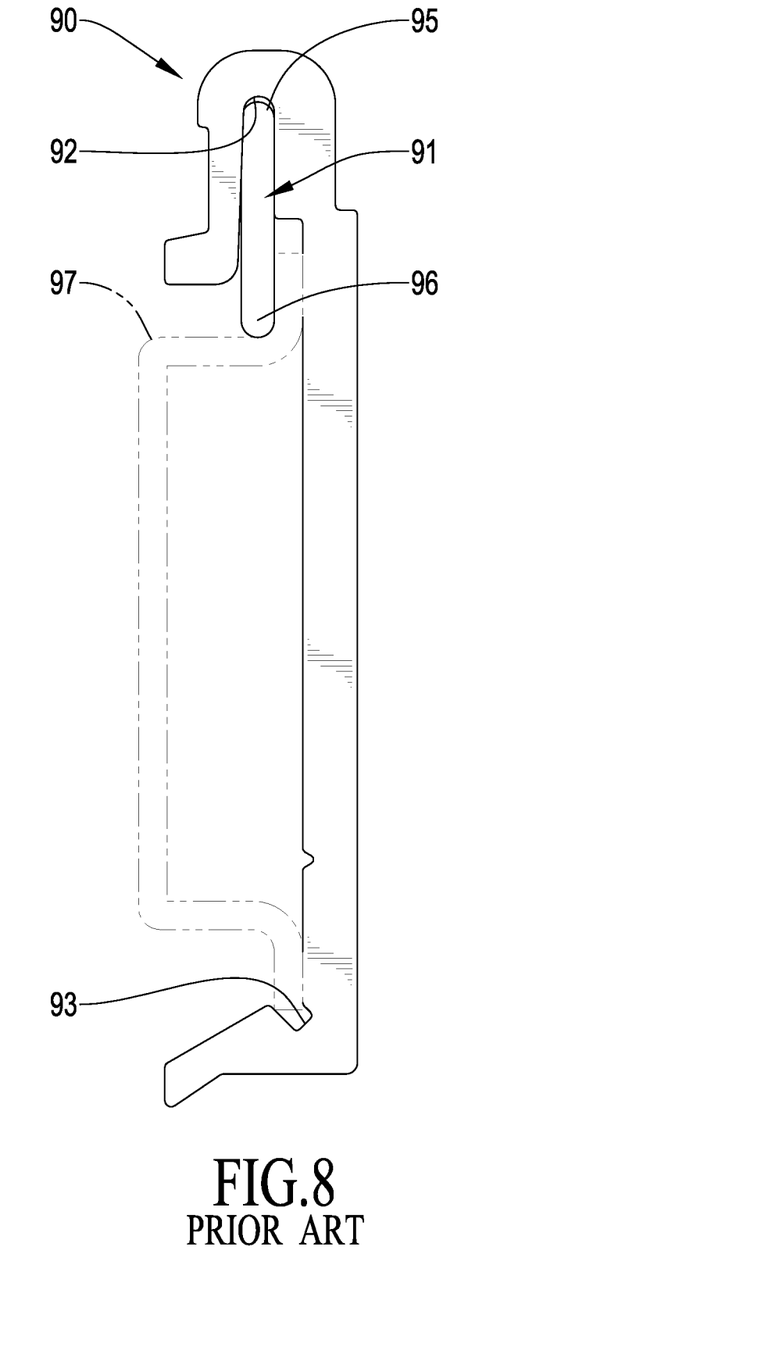
FIG. 8 is an operational side view of the conventional DIN rail mounting kit in FIG. 7 and shows the conventional DIN rail mounting kit mounted to a DIN rail.

With reference to FIG. 7, a conventional DIN rail mounting kit substantially comprises a body 90 and a steel wire 91. The body 90 is a bending sheet and includes an upper groove 92, a lower groove 93, and multiple locking holes 94 located between the upper groove 92 and the lower groove 93. The steel wire 91 is a W-shaped wire and includes a bending portion 95 being convex upward and two clamping portions 96 being convex downward and respectively located at opposite two sides of the bending portion 95. The steel wire 91 is partially inserted into the upper groove 92 and is fixed inside the upper groove 92 via the bending portion 95 via a conventional fixing manner, details of the conventional fixing manner are not further illustrated also. With reference to FIGS. 7 and 8, when the conventional DIN rail mounting kit is in use, the body 90 is mounted to a rear side of the electronic device by mounting multiple fasteners through the multiple locking holes 94 respectively. The body 90 is moved to align the upper groove 92 with an upper edge of a DIN rail 97, is moved down to compress the two clamping portions 96 of the steel wire 91 to bend the two clamping portions 96 upwardly. The upper edge of the DIN rail 97 is inserted into the upper groove 92 accordingly. Then the body 90 is swung to move the lower groove 93 toward the DIN rail 97 for aligning the lower groove 93 with a lower edge of the DIN rail 97. Eventually, the steel wire 91 is released to clamp the DIN rail 97 via an elastic force of the steel wire 91.

However, the conventional DIN rail mounting kit clamps the DIN rail 97 by the two clamping portions 96 located at the two opposite sides of the steel wire 91. When the conventional DIN rail mounting kit is installed, a level of two opposite sides of the conventional DIN rail mounting kit have to be maintained to press the two clamping portions 96 evenly. Therefore, the lower groove 93 is parallel to the DIN rail 97 and well engaged with the DIN rail 97. When a size of the electronic device is getting larger, the level of the opposite sides of the conventional DIN rail mounting kit is hard to be maintained. The two clamping portions 96 are usually pressed unevenly and the body 90 is titled. Accordingly, the lower edge of the DIN rail 97 hardly slides into the lower groove 93. Therefore, an extra effort has to be taken either to install or to uninstall the conventional DIN rail mounting kit.

To overcome the shortcomings, the present invention tends to provide a rail mounting kit to mitigate or obviate the aforementioned problems.

SUMMARY OF THE INVENTION

The main objective of the invention is to provide a rail mounting kit that has upper hooks and a sliding member for being rapidly clamped on or detached from the DIN rail.

A rail mounting kit comprises a base, a sliding member, multiple positioning pins, and an elastic member. The base has a body, two upper hooks, two limiting members, and a lower connecting portion. The body has a side surface, multiple upper locking holes formed through the body, and multiple lower locking holes formed through the body and located below the upper locking holes. The two upper hooks are spaced apart from each other and protrude from the side surface of the body. Each of the upper hooks has an upper groove located between the upper hook and the body. The two limiting members are spaced apart from each other and protrude from the side surface of the body. The lower connecting portion protrudes from the side surface of the body. The sliding member is located between the body and the two limiting members of the base and has a fixing portion and two side portions. The fixing portion has multiple sliding grooves formed through the fixing portion and extending downwardly and an upper connecting portion located above the lower connecting portion. The two side portions are spaced apart from each other and extend toward the body of the base from the fixing portion. Each of the side portions has an upper inclined edge facing away from the body of the base and a lower groove located between the upper inclined edge and the body of the base, and located lower than the upper groove of a corresponding one of the two upper hooks. Each of the positioning pins is mounted through a respective one of the sliding grooves and fixed in a respective one of the lower locking holes. The sliding member is able to slide relative to the positioning pins along the sliding grooves. The elastic member has two ends respectively connected to the lower connecting portion and the upper connecting portion.

Other objects, advantages and novel features of the invention will become more apparent from the following detailed description when taken in conjunction with the accompanying drawings.

DETAILED DESCRIPTION OF PREFERRED EMBODIMENT

Figure 1:
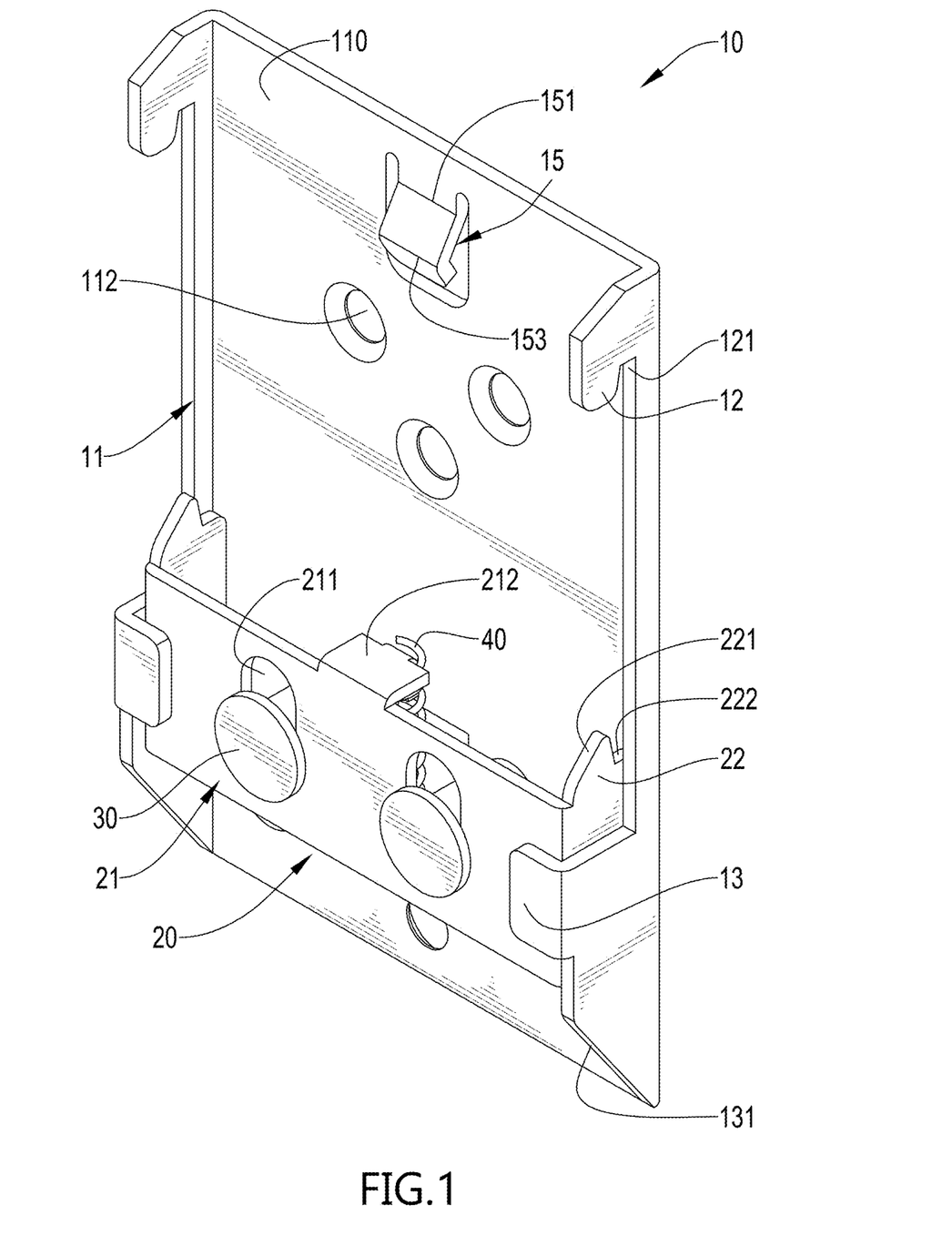
FIG. 1 is a perspective view of a rail mounting kit in accordance with the present invention.

With reference to FIG. 1, a rail mounting kit in accordance with the present invention comprises a base 10, a sliding member 20, multiple positioning pins 30, and an elastic member 40.

Figure 2:
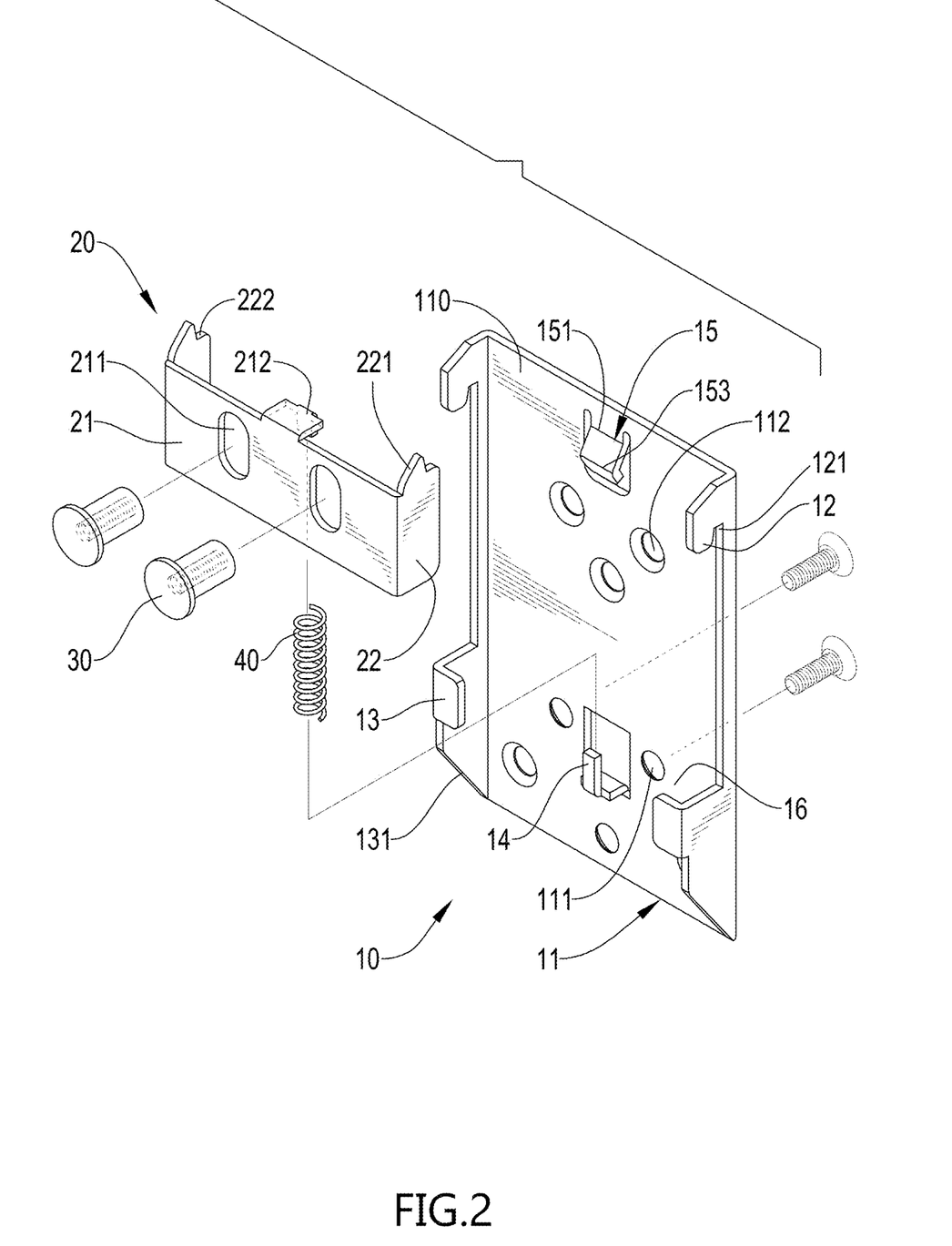
FIG. 2 is an exploded perspective view of the rail mounting kit in FIG. 1.

With reference to FIGS. 1 and 2, the base 10 is integrally made of a sheet by cutting and bending the sheet. The base 10 has a body 11, two upper hooks 12, two limiting members 13, a lower connecting portion 14, and a pushing member 15. The body 11 has a front side surface 110 and a rear side surface opposite to each other. Multiple upper locking holes 112 and multiple lower locking holes 111 are formed through the body 11. The upper locking holes 112 are located near a top end of the body 11 and the lower locking holes 111 are located near a bottom end of the body 11. The lower locking holes 111 are located below the upper locking holes 112. The two upper hooks 12 are spaced from each other and protrude from the front side surface 110 of the body 11. In the embodiment, the two upper hooks 12 are respectively formed at two opposite sides of the body 11 and are located near the top end of the body 11. Each upper hook 12 extends forwardly from the front side surface 110 of the body 11. When the base 10 is observed from one side, each upper hook 12 is similarly inverted U-shaped to form an upper groove 121 located between the upper hook 12 and the body 11 and has an opening facing downward. The two limiting members 13 are located in front of the body 11 to form a containing space 16 between the two limiting members 13 and the body 11. In the embodiment, the two limiting members 13 are respectively formed at the two opposite sides of the body 11, are located near the bottom end of the body 11, and protrude from the front side surface 110 of the body 11. The two limiting members 13 extend forwardly from the front side surface 110 of the body 11 and then extend toward each other. When the base 10 is observed form the top end of the base 10, each limiting member 13 is L-shaped. In the embodiment, each limiting member 13 has a lower inclined edge 131 formed at a bottom thereof. The lower inclined edge 131 downwardly extends and obliquely extends toward the body 11, but it is not limited thereto. In another embodiment, the lower inclined edge 131 of the limiting member 13 may be omitted. The lower connecting portion 14 protrudes from the front side surface 110 of the body 11 and is located near the bottom end of the body 11. The lower connecting portion 14 has an end portion spaced apart from the body 11 and extending upwardly. When the base 10 is observed from one side, the lower connecting portion 14 is L-shaped, but it is not limited thereto. The shape of the lower connecting portion 14 may be varied based on user's requirements. The pushing member 15 is a bending sheet having a connecting end 151 integrally connected to the body 11 and near the top end of the body 11. A pushing portion 153 of the pushing member 15 protrudes forwardly from the front side surface 110 of the body 11 and has a free end. The pushing portion 153 of the pushing member 15 extends obliquely and forwardly from the connecting end 151 and then bends toward the rear side surface of the body 11. The structure of the pushing member 15 is not limited thereto. In another embodiment, the pushing member 15 of the base 10 may be omitted.

Figure 3:
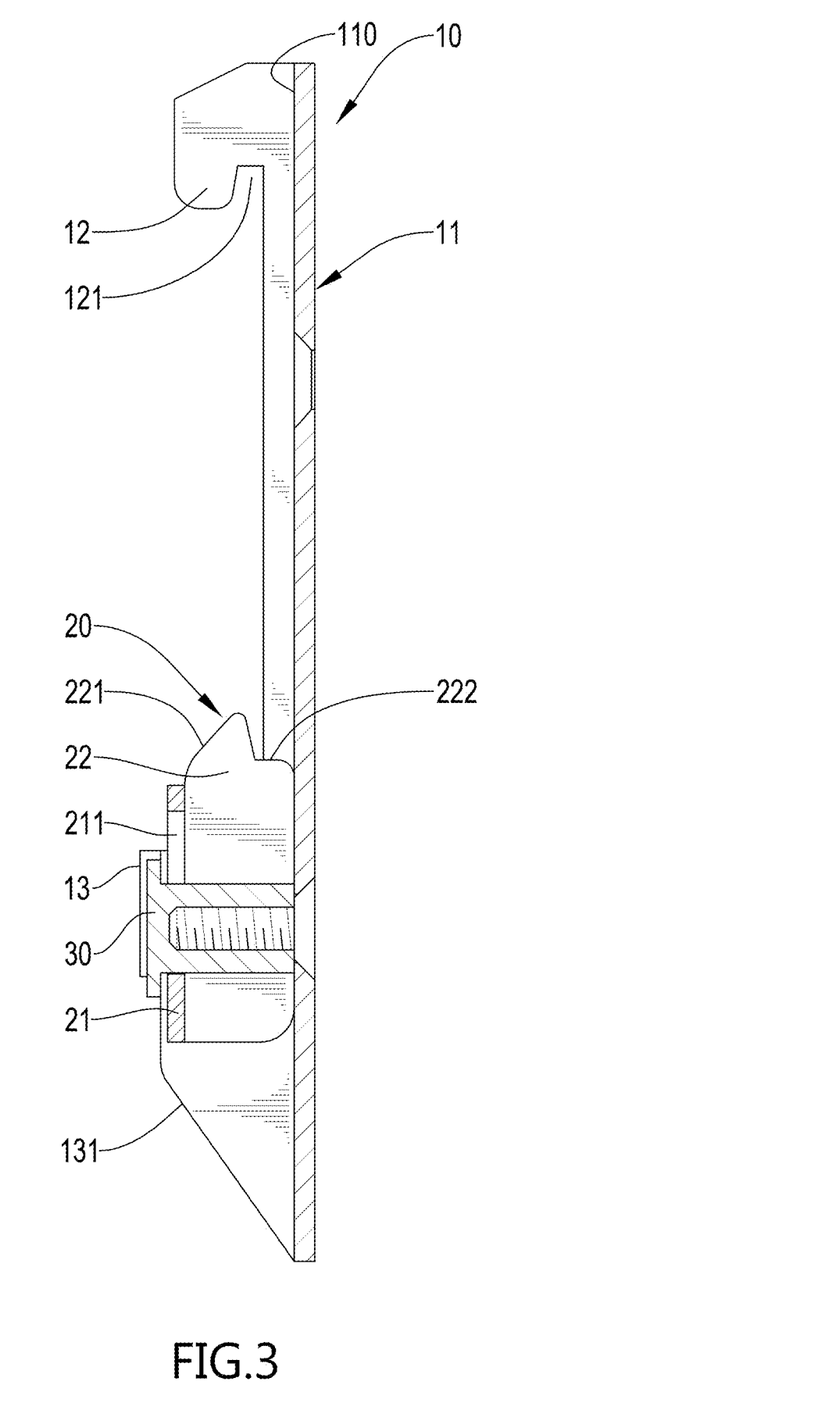
FIG. 3 is a cross sectional side view of the rail mounting kit in FIG. 1.
Figure 4:
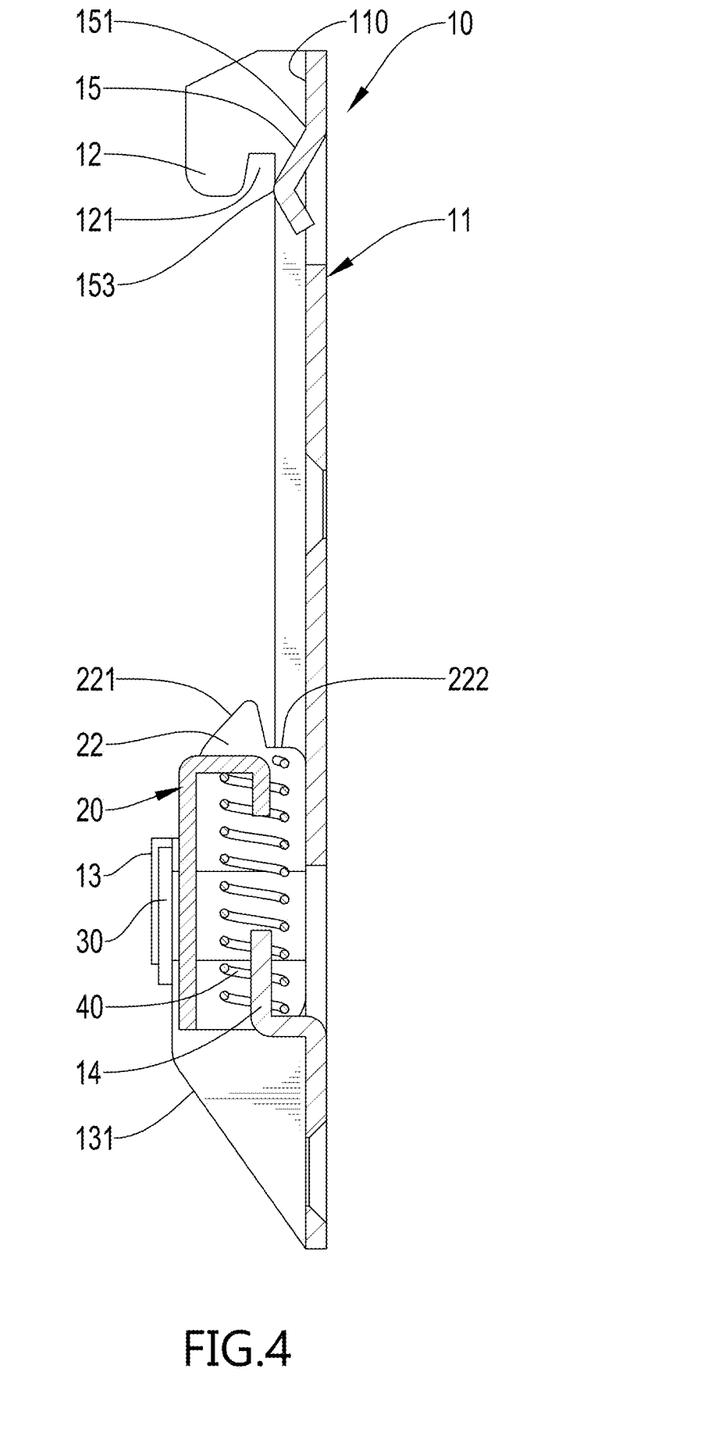
FIG. 4 is another cross sectional side view of the rail mounting kit in FIG. 1.

With reference to FIGS. 2 to 4, the sliding member 20 is integrally made of a sheet by cutting and bending the sheet. The sliding member 20 has a fixing portion 21 and two side portions 22. The fixing portion 21 has multiple sliding grooves 211 and an upper connecting portion 212. Each sliding groove 211 is formed through the fixing portion 21 and extends downwardly. The upper connecting portion 212 is formed on a top of the sliding member 20 and extends toward the body 11 of the base 10 and has an end portion extending downwardly. The shape of the upper connecting portion 212 is not limited thereto, and may be varied based on user's requirements. The two side portions 22 are spaced from each other and extend toward the body 11 of the base 10 from the fixing portion 21. The two side portions 22 respectively extend from two opposite edges of the fixing portion 21 and extend toward the body 11 of the base 10. Each side portion 22 has an upper inclined edge 221 and a lower groove 222. The upper inclined edge 221 faces away from the body 11 of the base 10, extends downwardly, and obliquely extends away from the body 11. The lower groove 222 is located lower than the upper groove 121 and is located between the body 11 and the upper inclined edge 221. In other words, openings of the lower grooves 222 of the two side portions 22 respectively align with the openings of the upper grooves 121 of the two upper hooks 12. The sliding member 20 is located in the containing space 16 between the body 11 and the limiting members 13. The upper connecting portion 212 is located above the lower connecting portion 14.

The positioning pins 30 are respectively mounted through the sliding grooves 211 of the sliding member 20 and are respectively fixed in the lower locking holes 111 of the base 10. The sliding member 20 can slide relative to the positioning pins 30 and the base 10 along the sliding grooves 211. In the embodiment, each positioning pin 30 has a screw hole formed in an end thereof. Multiple fasteners are respectively inserted into the lower locking holes 111 and are respectively screwed with the screw holes of the positioning pins 30 to fix the positioning pins 30 to the body 11. In the present invention, a fixing method of the each positioning pin 30 is not limited. The structure and the fixing method of each positioning pin 30 may be varied based on user's requirements.

The elastic member 40 has two ends respectively connected to the lower connecting portion 14 and the upper connecting portion 212. In the embodiment, the elastic member 40 is a compression spring having two ends respectively sleeved on the lower connecting portion 14 and the upper connecting portion 212 for positioning the elastic member 40 between the lower connecting portion 14 and the upper connecting portion 212, but it is not limited thereto. Types of the elastic member 40 may be varied based on user's requirements.

Figure 5:
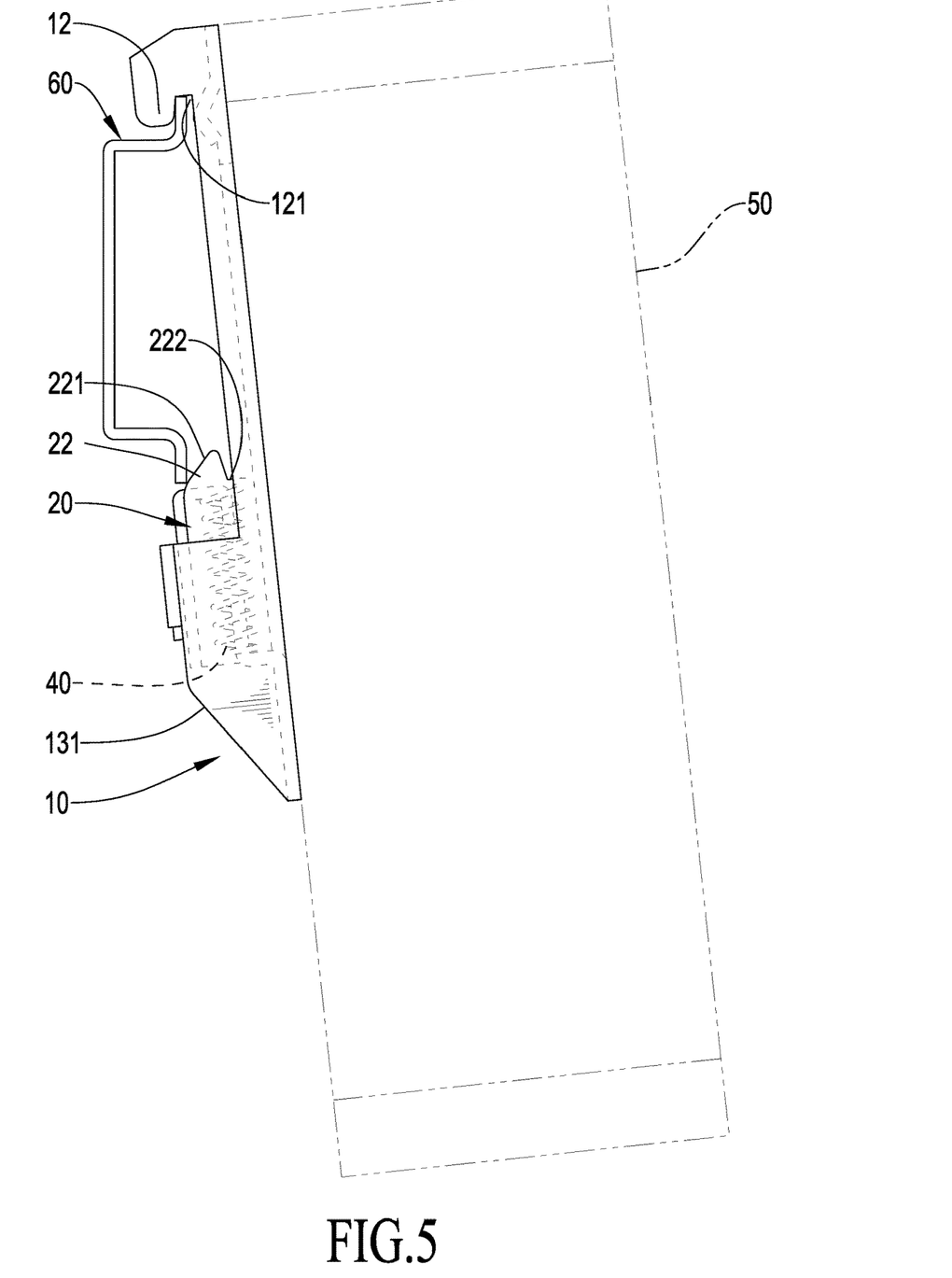
FIG. 5 is an operational side view of the rail mounting kit in FIG. 1.
Figure 6:
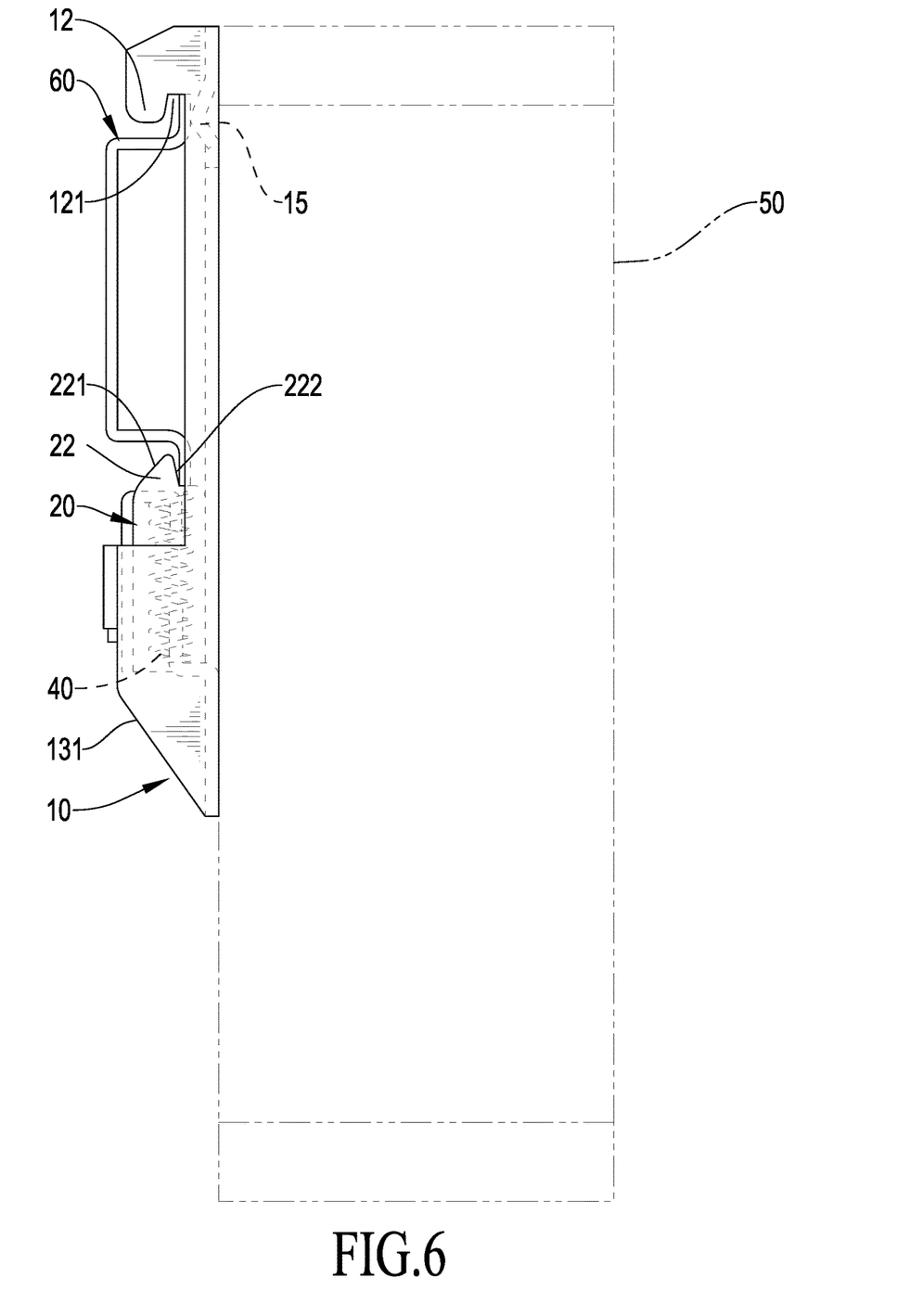
FIG. 6 is another operational side view of the rail mounting kit in FIG. 1.

With reference to FIGS. 1, 5, and 6, when the rail mounting kit in accordance with the present invention is in use, the rail mounting kit is fastened to an electronic device 50 via multiple fasteners mounted through the upper locking holes 112 from the front side surface 110 of the body 11. To mount the electronic device 50 on a DIN rail 60, the upper hooks 12 are hung on a top edge of the DIN rail 60 via the upper grooves 121, and the sliding member 20 is swung toward the DIN rail 60 to abut against the bottom edge of the DIN rail 60 via the upper inclined edges 221 of the side portions 22 of the sliding member 20. While the upper inclined edges 221 abut against the bottom edge of the DIN rail 60, the sliding member 20 is pushed to move down relative to the base 10 to compress the elastic member 40 to allow the bottom edge of the DIN rail 60 to slide into the lower grooves 222 along the upper inclined edges 221. After that, the elastic member 40 is released to push the sliding member 20 upwardly to clamp the DIN rail 60. Therefore, the DIN rail 60 is clamped between the upper hooks 12 and the sliding member 20 to fix the rail mounting kit on the DIN rail 60. The pushing member 15 is flexible and pushes the DIN rail 60 forwardly via an elastic restoring force of the flexible pushing member 15. The DIN rail 60 is clamped between the upper hooks 12 and the pushing member 15. A front side and a rear side of the DIN rail 60 are respectively abutted against the upper hooks 12 and the pushing member 15. To remove the electronic device 50 from the DIN rail 60, the electronic device 50 is moved up to separate the upper hooks 12 form the top edge of the DIN rail 60, and then the electronic device 50 is leaned away from the DIN rail 60. Therefore, the electronic device 50 and the DIN rail 60 successfully separate from each other. The rail mounting kit of the present invention is not restricted for DIN rails only. The rail mounting kit of the present invention can also be adapted to other types of rails.

As the sliding member 20 is able to slide upwardly and downwardly relative to the upper hooks 12 for clamping a rail, the rail mounting kit of the present invention can be intuitively installed or uninstalled and can be precisely fixed to the rail. Compared with the conventional DIN rail mounting kit, extra effort is saved without keeping the level of the rail mounting kit of the present invention. Accordingly, installation or uninstallation of the rail mounting kit in accordance with the present invention is easy and convenient.

In the present invention, the pushing member 15 protrudes from the body 11 for laterally pushing the DIN rail 60. The pushing member 15 provides the DIN rail 60 with a lateral clamping force for steadily fixation In the present invention, the lower inclined edges 131 of the limiting members 13 prevent the rail mounting kit of the present invention from bumping a wall fixed by the DIN rail 60 during installation or uninstallation. Therefore, the rail mounting kit of the present invention is free from being damaged or getting stuck by the wall.

In the embodiment of the present invention, the base 10 has two upper hooks 12 and two limiting members 13. The sliding member 20 has two side portions 22. Practically, the number of the upper hooks 12, the number of the limiting members 13, and the number of the side portions 22 are not restricted. The base 10 may have multiple upper hooks 12 and multiple limiting members 13, and the sliding member 20 may have multiple two side portions 22.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A rail mounting kit comprising:
    a base having;
        a body having
            a side surface;
            multiple upper locking holes formed through the body; and
            multiple lower locking holes formed through the body and located below the upper locking holes;
        two upper hooks spaced apart from each other, protruding from the side surface of the body, and each of the upper hooks having an upper groove located between the upper hook and the body;
        two limiting members spaced apart from each other and protruding from the side surface of the body;
        a containing space formed between the limiting members and the body; and
        a lower connecting portion protruding from the side surface of the body;
    a sliding member located between the body and the two limiting members of the base and located in the containing space, and the sliding member having
        a fixing portion having
            multiple sliding grooves formed through the fixing portion and extending downwardly; and
            an upper connecting portion located above the lower connecting portion;
        two side portions spaced apart from each other, extending toward the body of the base from the fixing portion, and each of the side portions having
            an upper inclined edge facing away from the body of the base; and
            a lower groove located between the upper inclined edge and the body of the base, and located lower than the upper groove of a corresponding one of the two upper hooks;
    multiple positioning pins, each of the positioning pins mounted through a respective one of the multiple sliding grooves and fixed in a respective one of the multiple lower locking holes;
    the sliding member being able to slide relative to the multiple positioning pins along the multiple sliding grooves; and
    an elastic member having two ends respectively connected to the lower connecting portion of the base and the upper connecting portion of the sliding member;
    wherein the two upper hooks are respectively formed at two opposite sides of the body, are near a top end of the body, and extends toward the sliding member;
    the two limiting members are respectively formed at two opposite sides of the body, are near a bottom end of the body, and extend toward the sliding member;
    each of the limiting members has a lower inclined edge formed at a bottom of the limiting member, downwardly extending, and obliquely extending toward the body.

2. The rail mounting kit as claimed in claim 1, wherein the upper connecting portion extends toward the body of the base from the fixing portion and has an end portion extending downwardly; and
the lower connecting portion extends toward the sliding member and has an end portion extending upwardly.

3. The rail mounting kit as claimed in claim 2, wherein the elastic member is a compression spring and has two ends sleeved on the upper connecting portion and the lower connecting portion respectively.

4. The rail mounting kit as claimed in claim 1, wherein the base has a pushing member being a bending sheet;
the pushing member has a connecting end connected to the body and a pushing portion protruding from the side surface of the body.

5. The rail mounting kit as claimed in claim 2, wherein the base has a pushing member being a bending sheet;
the pushing member has a connecting end connected to the body and a pushing portion protruding from the side surface of the body.

6. The rail mounting kit as claimed in claim 3, wherein the base has a pushing member being a bending sheet; the pushing member has a connecting end connected to the body and a pushing portion protruding from the side surface of the body.

* * * * *